(12) United States Patent
Chen et al.

(10) Patent No.: US 9,680,414 B1
(45) Date of Patent: Jun. 13, 2017

(54) FREQUENCY AND AMPLITUDE STABILIZATION IN MEMS AND NEMS OSCILLATORS

(71) Applicant: UCHICAGO ARGONNE, LLC, Chicago, IL (US)

(72) Inventors: Changyao Chen, Wilmette, IL (US); Omar Daniel Lopez, Chicago, IL (US); David A. Czaplewski, Naperville, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 15/042,912

(22) Filed: Feb. 12, 2016

(51) Int. Cl.
| | |
|---|---|
| *H03B 5/30* | (2006.01) |
| *H03L 7/00* | (2006.01) |
| *H03K 5/003* | (2006.01) |
| *H03K 5/13* | (2014.01) |
| *B81B 7/02* | (2006.01) |
| *H03G 3/20* | (2006.01) |
| *H03K 5/00* | (2006.01) |

(52) U.S. Cl.
CPC ............... *H03B 5/30* (2013.01); *B81B 7/02* (2013.01); *H03G 3/20* (2013.01); *H03K 5/003* (2013.01); *H03K 5/13* (2013.01); *H03L 7/00* (2013.01); *H03K 2005/00286* (2013.01)

(58) Field of Classification Search
CPC .................................. H03G 3/20; B81B 7/02
USPC ..... 74/490.1, 490.09; 330/137; 331/154, 96, 331/116 M, 158, 107 A
See application file for complete search history.

(56) References Cited

U.S. PATENT DOCUMENTS

| | | | |
|---|---|---|---|
| 6,763,340 B1 | 7/2004 | Burns et al. | |
| 7,552,645 B2 | 6/2009 | Bargatin et al. | |
| 8,063,535 B2 | 11/2011 | Mohanty et al. | |
| 8,836,444 B2 | 9/2014 | Lopez et al. | |
| 9,000,833 B2 | 4/2015 | Caffee et al. | |
| 2006/0061425 A1* | 3/2006 | Arigliano | H03K 5/1565 331/36 C |
| 2014/0266509 A1 | 9/2014 | Caffee et al. | |
| 2015/0177272 A1 | 6/2015 | Clark | |

\* cited by examiner

*Primary Examiner* — Arnold Kinkead
(74) *Attorney, Agent, or Firm* — Foley & Lardner LLP

(57) ABSTRACT

This invention comprises a nonlinear micro- and nanomechanical resonator that can maintain frequency of operation and amplitude of operation for a period of time after all external power has been removed from the device. Utilizing specific nonlinear dynamics of the micromechanical resonator, mechanical energy at low frequencies can be input and stored in higher frequencies modes, thus using the multiple degrees of freedom of the resonator to extend its energy storage capacity. Furthermore, the energy stored in multiple vibrational modes can be used to maintain the resonator oscillating for a fixed period of time, even without an external power supply. This is the first demonstration of an "autonomous" frequency source that can maintain a constant frequency and vibrating amplitude when no external power is provided, making it ideal for applications requiring an oscillator in low power, or limited and intermittent power supplies.

20 Claims, 7 Drawing Sheets

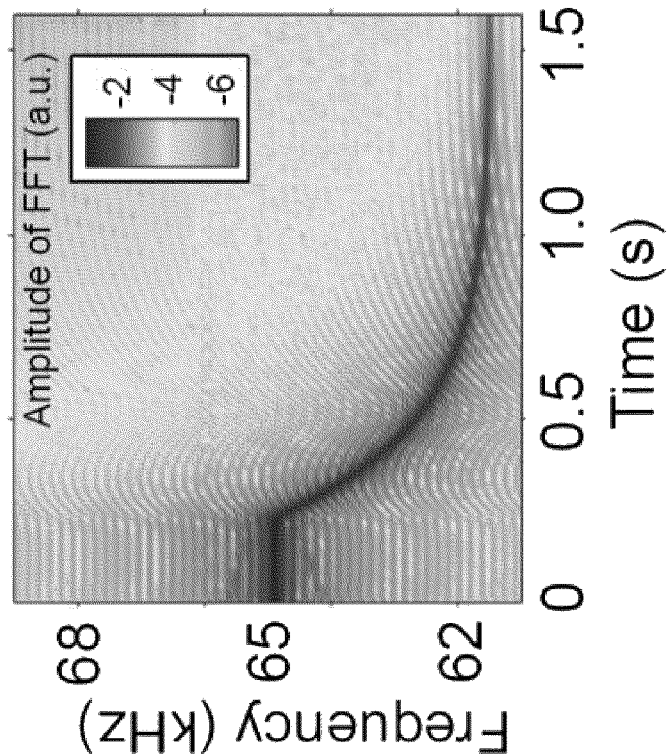
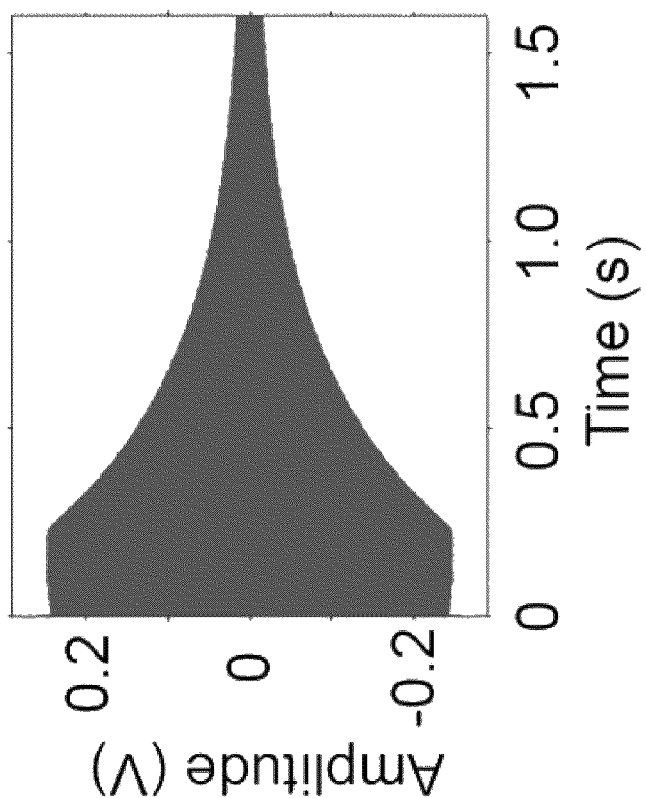
FIG. 4B
FIG. 4A

FREQUENCY AND AMPLITUDE STABILIZATION IN MEMS AND NEMS OSCILLATORS

The United States Government has rights in this invention pursuant to Contract No. DE-AC02-06CH11357 between the United States Department of Energy and the UChicago Argonne, LLC, representing Argonne National Laboratory.

TECHNICAL FIELD

The present disclosure relates generally to micro- and nano-mechanical oscillators and the methods of forming the same.

BACKGROUND

Mechanical oscillators are an essential component of practically every electronic system that requires a frequency reference for time keeping or synchronization, and oscillators are also widely used in frequency-shift based sensors of mass, force, and magnetic field. Currently, micro- and nano-mechanical (collectively referred to as "micromechanical" herein) oscillators are being developed as an alternative to conventional oscillators, e.g. quartz oscillators, supported by their intrinsic compatibility with standard semiconductor processing and by their unprecedented sensitivity and time response as miniaturized sensing devices.

Devices that use the micromechanical oscillators in a limited or no power environment require the use of alternative sources of power to run, for example an external portable power generation or batteries. In some applications this is infeasible due to the limited space and carrying capacity of the situations. Consequently, when the power is deprived on these devices, the amplitude of the oscillation decreases, the frequency of the oscillation changes, or both occur. This is impractical and unworkable when using micromechanical oscillators in a power deprived environment.

SUMMARY

Embodiments described herein relate generally to micromechanical oscillators and the methods of forming the same and, in particular, using device parameters and dynamics in conjunction with higher-order nonlinearities to maintain a constant frequency and amplitude when the external power supply is removed.

In some embodiments, a method for maintaining an amplitude and frequency of operation while not being powered over a given period of time. The method includes, powering an oscillator with an external power source, amplifying a voltage, using an amplifier, from the oscillator and converting a motional current to a voltage using a transimpedance amplifier, from an oscillator, and attaining an amplitude and an operating frequency in the oscillator. Maintain the operating frequency, phase shifting the amplified voltage and setting an amplitude of the phase shifted voltage. An oscillator is driven using the phase shifted voltage, wherein the phase shifted voltage drives the oscillator, wherein the oscillator is at an internal resonance condition based at least on the amplitude of the phase shifted voltage, and wherein the internal resonance condition stabilizes frequency oscillations in the oscillator. The oscillator attains a first mode and a second mode, wherein energy is transferred from the first mode to the second mode in the internal resonance condition, and wherein the transferred energy stabilizes the frequency oscillations in the oscillator. A resonator is placed in self-sustained motion and drives the oscillator using the resonator, wherein the phase shifted voltage drives the oscillator to non-linear behavior. The external power source is removed causing the energy stored in the second mode to transfer to the first mode maintaining the oscillator amplitude and the oscillator frequency.

An illustrative system includes an amplifier operably connected to a phase shifter, wherein the amplifier is configured to amplify a voltage or current from an oscillator and sustain an oscillator amplitude and an oscillator frequency. The phase shifter operably connected to a driving amplitude control, wherein the phase shifter is configured to phase shift the amplified voltage, the driving amplitude control configured to set an amplitude of the phase shifted voltage. The oscillator is operably connected to the driving amplitude control, wherein the phase shifted voltage drives the oscillator, wherein the oscillator is at an internal resonance condition based at least on the amplitude of the phase shifted voltage, and wherein the internal resonance condition stabilizes frequency oscillations in the oscillator. A resonator is placed into self-sustained motion and operably connected to a connection terminal wherein a first electrode in the resonator applies a periodic electrostatic force and a second electrode in the resonator is used to transduce the motion of the resonator through a motional current. The phase shifted voltage drives the oscillator, the oscillator is driven to non-linear behavior, wherein the oscillator comprises a first mode and a second mode, wherein energy is transferred from the first mode to the second mode in the internal resonance condition, and the transferred energy is stored in the second mode and the transferred energy stabilizes the frequency oscillations in the oscillator. When the external power source is operably disconnected from the oscillator, the energy stored in the second mode is transferred to the first mode maintaining the oscillator amplitude and the oscillator frequency.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 4A is an illustration of the measured temporal evolution of the oscillation after the excitation is removed from a clamped-clamped silicon resonator operating in a nonlinear regime and inside of the internal resonant mode coupling.

FIG. 4B is an illustration of the temporal frequency response of the oscillation involved in the measured temporal evolution shown in FIG. 4A.

Figure 1:
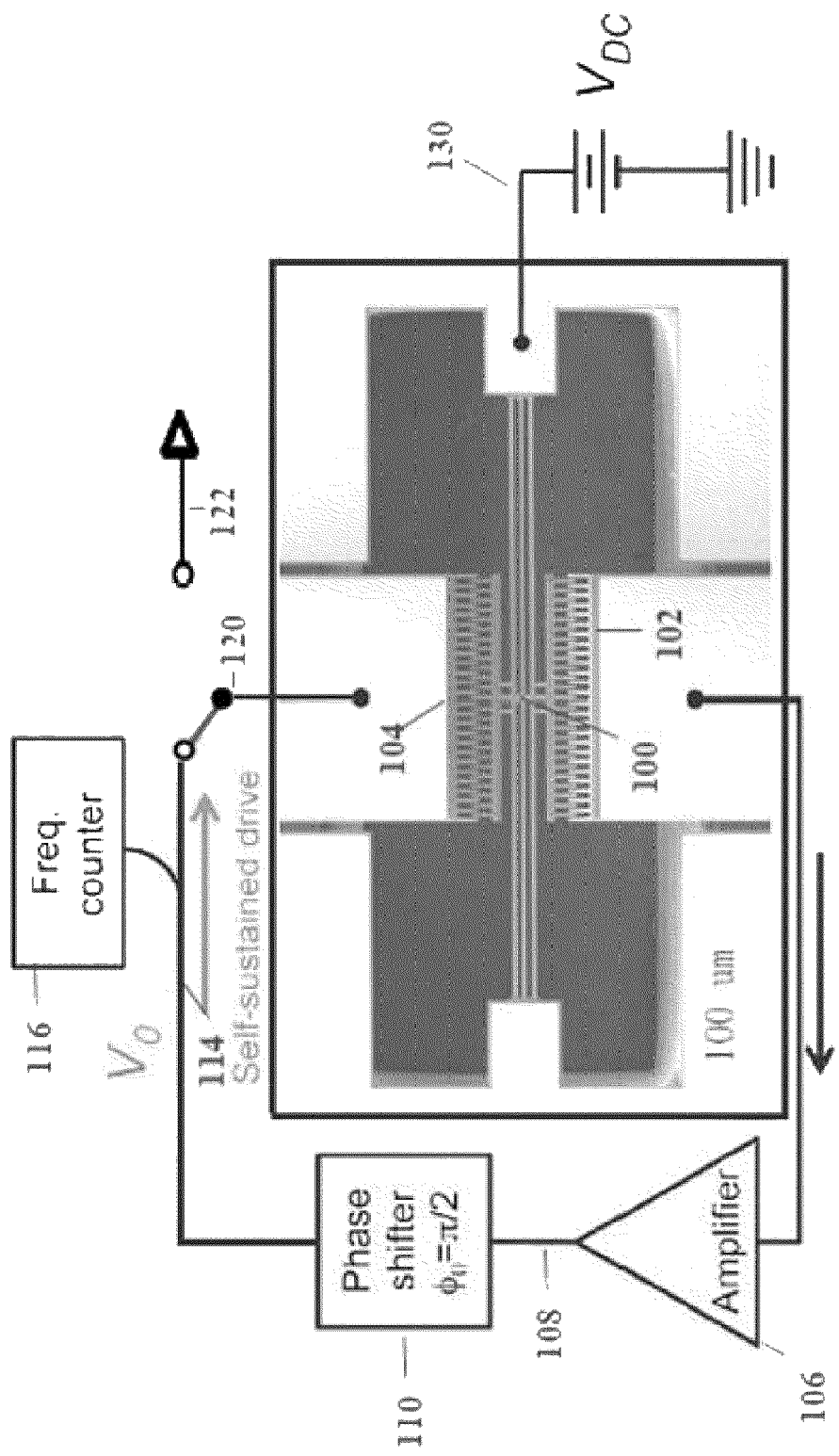
FIG. 1 is a circuit schematic of a clamped-clamped silicon resonator capable of being placed into and removed from a feedback loop.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to micromechanical oscillators and methods for forming such oscillators.

Oscillators have a variety of applications in the field of clock operation or frequency standard, however they are unreliable when operating in low power consumption, under a duty cycle, through power disruptions or with intermittent power supplies. Additionally, oscillators lack the capacity to continue operation once an external power source is removed (even if the removal is for a brief moment) resulting in a loss of amplitude and frequency of operation. Currently, the solution requires providing additional sources of power, such as batteries or portable power generators, but this is limited in duration and has the added burden of extra weight for transport and operation. These factors would seem to limit micromechanical oscillators from being used in timing and other applications in low power applications or where power can be intermittent or unstable.

In contrast, embodiments of the oscillator described herein and methods of constructing the same show that, contrary to the prior art limitations of an oscillator incapable of working without an external energy supply or reference for calibration, a self-sustaining oscillator driven by the present invention's specific non-linear regime and construction results in an autonomous oscillator that can operate without an external power supply while keeping a constant amplitude and frequency. By combining the micromechanical oscillator's intrinsic nonlinear dynamics with an energy exchange between, at least, two different vibrational modes coupled through an internal resonance, the resulting micromechanical oscillator can maintain a constant amplitude and frequency operation while not being powered by an external source.

In one implementation, the configuration of an oscillator to harness the nonlinearities in micromechanical systems is such that the oscillator is driven to the condition of internal resonance ("IR") condition resulting in a mutual energy transfer between the coupled modes. Through the IR condition, the oscillator is able to store energy in a higher order vibrational mode, and that stored energy is later extracted to maintain operation when an external feedback loop is removed. The structure of the embodiments of the present invention allows for a continuous voltage output signal at a constant amplitude and a constant frequency for a length of time after removal from an external power source.

In some embodiments, the micromechanical resonator is a clamped-clamped beam resonator. This type of structure simplifies fabrication at the nanoscale, allows Lorentz force actuation and electromotive detection, and has much higher resonant frequencies than other structures with similar dimensions due to the constraints placed on the ends of the beams. The dynamics of a clamped-clamped beam can be approximated by that of a mass-spring system with a non-linear restoring force $F_r = -k_1 x - k_3 x^3$, where x is the displacement of the beam, $k_1$ is a linear elastic constant, and $k_3$ is a nonlinear elastic constant caused by the elongation of the beam as it moves laterally.

In some embodiments, the clamped-clamped beam resonator can be of a flexure based compliant mechanism, for example, a flexural design. A flexural resonator can be comprised of three, doubly clamped, single crystal silicon beams with comb drives located at the midpoint of the beams on both sides. The beams are anchored together to move as a single resonator. One of the comb drives is used to apply the oscillatory drive signal to the resonator while the other comb drive is used to measure the motional current that results from the movement of the resonator. The primary motion of the resonator is an in-plane flexural motion and the clamped ends of the beams allows for even small displacements to cause the restoring force to become nonlinear. Due to the geometry, a flexural resonator produces a hardening nonlinearity. In other words, the frequency will grow with increasing amplitude until the solution reaches the bifurcation point and transitions to a lower curve. In a particular embodiment, the clamped-clamped beam resonator is a silicon structure composed of three interconnected beams, 500 µm in length, 3 µm wide, and 10 µm thick, that are clamped at the two ends of the three beams.

In its principal oscillation mode, the micromechanical oscillator capacitively produces an output current proportional to the transverse displacement by means of a comb drive electrode. A transimpedance amplifier converts the current to a voltage. After a voltage amplification, the resulting signal is conditioned by shifting the phase by a set amount ($\phi_0$) and the amplitude is fixed to be $V_0$. This conditioned signal is then reintroduced through another comb drive electrode. The signal is a driving capacitive force that is time varying and proportional to $V_{dc}V(t)$ [where DC voltage $(V_{dc}) \approx 5$ V>>V(t)].

When in the closed loop, the oscillator's parallel beams sustain a vibration having an amplitude $A_0$, a frequency $\Omega_0$ (both determined by the combination of the mechanical properties), a phase shift $\phi_0$ and a voltage $V_0$. As a result of the structure, the amplitude $A_0$ attains a maximum when the driving force is in phase with the oscillation velocity. This resonance condition is achieved in the phase shifter by advancing the oscillating signal by $\phi_0 = \pi/2$. This results in the frequency of the self-sustained oscillations $\Omega_0$ increasing as the Voltage $V_0$ increases, a byproduct of the hardening nonlinearity in the dynamics of the oscillator.

Generally, the motion of the principal oscillation mode is described by Newton's equation for a normal coordinate x(t), with a cubic nonlinear term, given by the Duffing equation:

$$m\ddot{x} + \gamma\dot{x} + kx + k_3 x^3 = F_0 \cos(\phi + \phi_0)$$

where m is the effective mass, $\gamma$ is the damping constant, k is the linear force spring constant, $k_3$ is the cubic-force spring constant, $F_0$ is the self-sustaining force, $F_s$ is the external harmonic perturbation and $\Omega_s$ is the frequency of the externally applied harmonic perturbation.

Normalizing by the spring constant k and choosing time units such that the natural frequency of the principal mode equals unity ($t\sqrt{k/m} = t$), then the equation of motion reads:

$$\ddot{x} + Q^{-1}\dot{x} + \beta x^3 = f_0 \cos(\phi + \phi_0)$$

where the quality factor is $Q = \sqrt{km}/\gamma$, $\beta$ is the ratio of cubic-force spring constant to the linear spring constant, $f_0$ is the self-sustaining force normalized by the spring constant. The cubic-term coefficient $\beta$ is positive for hardening and negative for softening nonlinearities.

The amplitude, $f_0$, and phase shift, $\phi_0$, of the self-sustaining force determine the conditioning of the feedback signal. In the present invention, the phase shift was in the range of 20° and 90°, as the self-sustaining force is maximized when the phase shift is 90°. The angle $\phi(t)$ is the instantaneous oscillation phase of the coordinate x(t). The coordinate phase is determined by $x(t) = A_0 \cos \phi = A_0 \cos \Omega'_0 t$, and the present invention's system attains oscillations of frequency $\Omega'_0$ and amplitude $A_0$ results in the explicit expressions:

$$\Omega'_0 = \frac{1}{\sqrt{2}}\left[1 + (1 + 3\beta Q^2 f_0^2)^{\frac{1}{2}}\right]^{\frac{1}{2}}$$

$$A_0 = Qf_0/\Omega'_0$$

In the nonlinear regime, unlike in the linear one, the resonant frequency has a strong dependence with the oscillation amplitude, an effect similar to what in the quartz literature is known as the amplitude-frequency (a-f) effect. Since amplitude fluctuations translate into frequency fluctuations, the a-f effect considerably increases the frequency noise of the oscillator and thus the benefits of operating at higher amplitudes are undone by the noise increase inherent to operating in the nonlinear regime.

Under specific constructions, the oscillation frequency of nonlinear self-sustaining micromechanical resonators stabilizes and energy can be exchanged between multiple vibrational modes. In one embodiment, this can be achieved by coupling two different vibrational modes through an internal resonance, where the energy exchange between modes is such that the resonance of one mode absorbs the amplitude and frequency fluctuations of the other, effectively acting as a stabilizing mechanical negative feedback loop. In other words, at internal resonance, the motion of the first mode causes the motion of the second mode. For example, two modes of an oscillator can be coupled together, such that an energy exchange between the two modes occurs. The energy exchange can be such that the amplitude associated with each mode are inversely related. As an example, energy from a first mode can provide energy to a second, the increased energy can increase the amplitude of the second mode and the amplitude of the first mode can be reduced, due to the energy transferred to the second mode. The changes in the different amplitudes can stabilize the oscillation frequency of nonlinear self-sustaining micromechanical resonators. In addition to the structure described below, the coupling between the two modes could be produced by an asymmetry of design. For example, the coupling between the first mode and the second mode could be produced by an asymmetry in the design, an asymmetry in the activation, an overhang in the support of the device, or various other means available to couple two modes of a resonant structure.

Focusing on the energy exchange and storage interaction between the two modes, a characterization can occur in open loop mode when the first mode is driven along the upper branch of the nonlinear resonant curve with an external frequency source, an internal resonance can occur. At the IR frequency, the first mode couples with another mode, a second mode, with a higher frequency, driving it into resonance and resulting in a transfer of mechanical energy between the two modes. This higher frequency mode drains mechanical energy from the first mode, reducing its amplitude to the point where oscillations at that frequency are unstable, thus causing the amplitude to drop to the lower branch of the resonant curve. Since the dominant nonlinearity is cubic, an internal resonance occurs if this other mode has a frequency three times larger than the first mode. When operating in closed loop and the system is driven to the internal resonance condition, a strong interaction between the first and the higher frequency mode is expected and an internal resonance occurs. In short, when operating in closed loop in the internal resonance condition, the amplitude of the first mode is stabilized by the exchange of energy with the second mode, which stabilizes the frequency; the increasing driving amplitude helps reach the internal resonance, however too much driving amplitude ends the internal resonance condition.

Coupling, and subsequent energy storage, can occur between more than two modes. In an example embodiment, mode 1 is referred to as the in-plane or fundamental mode, and shows a hardening nonlinearity due to the geometry of the clamped-clamped beam. The additional modes are high frequency modes that can be both in-plane and out-of-plane, primary and secondary flexural modes, and also torsional modes. If the additional mode, for example mode 2, is torsional and it can show a softening nonlinearity, if any, due to the electrostatic potential introduced by the driving and detection electrodes. In contrast, the additional mode, for example mode, is flexural, like the first mode, it should show a hardening nonlinearity due to the geometry of the clamped-clamped beam resonator, as the first mode does.

The present invention's specific structure of an autonomous silicon micromechanical oscillator with linear feedback, stable oscillations ensured by Duffing nonlinearity and controlling phase-delay on the feedback loop to generate an IR allows for the oscillator to vibrate with a stabilized frequency after the feedback loop is disengaged. The micromechanical oscillator's construction is such that at least two different vibration modes occur with controlled frequency ratio, for example 3:1, within the detuning range of the oscillator. The design of the device and the ability of two modes to couple through a forcing, displacement, or velocity term allows for the generation of the internal resonance condition. Additionally, detuning is possible by changing the parameter of the feedback loop to correspondingly change the frequency of the oscillation.

By driving the constituent resonators into a nonlinear regime, the oscillators show improvement in frequency stability and reduction of phase noise. Further, the autonomous oscillating motion is initiated by thermal noise acting on the beam, whose velocity is then transduced to voltage and linearly amplified, before feeding back to drive the beam. As the vibrational amplitude grows, the oscillation frequency also increases due to the Duffing nonlinearity. The increasing frequency leads to larger viscous damping, until the energy dissipated through damping balances the energy supplied from the sustaining amplifiers, therefore arriving at stable oscillations.

FIG. 1 is a circuit schematic of an example embodiment of a clamped-clamped silicon oscillator with a flexural resonator 100 in a closed loop configuration maintains a continuous voltage output signal at a constant amplitude and constant frequency for a length of time after removing the oscillator from closed loop operation. The clamped-clamped silicon oscillator is structured so that it has a linear resonant frequency of 61.6 kHz and a quality factor of 120,000. The motion of the resonator 100 can be detected capacitively, for example, using a detection electrode 102 that creates capacitive current through a comb electrode. The displacement of the resonator creates a change in capacitance in the voltage biased comb drive electrode, which generates a current that is introduced into a current amplifier 106. The amplifier 106 produces a voltage output proportional to the oscillation amplitude 108. The voltage output can be first phase shifted using a phase shifter 110. For example, the phase shifter 110 can be an active analog implementation of an all-pass filter. FIG. 1 is a circuit schematic of an example embodiment of a clamped-clamped silicon oscillator with a flexural resonator 100 in a closed loop configuration maintains a continuous voltage output signal at a constant amplitude and constant frequency for a length of time after removing the oscillator from closed loop operation. The clamped-clamped silicon oscillator is structured so that it has a linear resonant frequency of 61.6 kHz and a quality factor of 120,000. The motion of the resonator 100 can be detected capacitively, for example, using a detection electrode 102 that creates capacitive current through a comb electrode. The displacement of the resonator creates a change in capacitance in the voltage biased comb drive electrode, which generates a current that is introduced into a amplifier 106. The amplifier 106 may be a transimpedance amplifier, which converts a current into a voltage at 108. In some arrangements, the amplifier 106 may be a voltage amplifier, such that the input of a small voltage signal is amplified at 106 to produce a large voltage signal at 108. The amplifier 106 produces a voltage output proportional to the oscillation amplitude 108. The voltage output can be first phase shifted using a phase shifter 110. For example, the phase shifter 110 can be an active analog implementation of an all-pass filter.

The resulting signal at the output is phase shifted and with an amplitude that is controlled by the amplification in the amplifier and the phase shift of the signal. This resulting signal can be input into a driving electrode that can be used to drive the resonator 100. The resulting signal can also be input in a frequency meter 116 to measure the frequency of the oscillations. The frequency meter 116 can be a digital frequency counter. The phase shift between the excitation and the detection signal determines the point in the resonance curve where the resonator 100 operates.

The flexural resonator 100 is constructed such that the thermal noise acting on the beam, whose velocity is then transduced to voltage and linear amplified, before feeding back to drive the beam. As the vibrational amplitude grows, the oscillation frequency 114 increases due to the Duffing nonlinearity and can be tuned by the phase shifter 110. The increasing frequency leads to larger viscous damping, until the energy dissipated through damping balances the energy supplied from the sustaining amplifiers, therefore arriving at stable oscillations. The frequency stabilization by internal resonance in the oscillator in FIG. 1 is due to the transfer of energy from the first oscillation mode, the in-plane flexural mode, to the higher frequency mode, the principal torsional mode.

When the resonator is in a feedback loop 120, the oscillator outputs a voltage with a given amplitude and operating frequency 114. However, when the resonator 100 has been removed from the feedback loop 122 and is no longer powered by the external power supply 130, the oscillator continues to output a voltage at the same amplitude and frequency 114 as before, for a given period of time recovering the energy stored in the higher mode within the resonator 100. If the resonator 100 is placed back in the feedback loop 120 before the amplitude starts to decay, then the output voltage is constant with a constant frequency the entire time even as the feedback loop is opened 122 and closed 120, thus demonstrating the ability to store and recover vibrational energy in coupled modes. In other embodiments, the lower frequency mode can be in-plane flexural mode, but the high frequency modes can be both in-plane and out-of-plane, primary and secondary flexural modes, bulk modes, surface acoustic modes and also torsional modes. Therefore, the possibility of coupling with different types of modes gives great flexibility for the design of oscillators using this stabilization mechanism.

Figure 2:
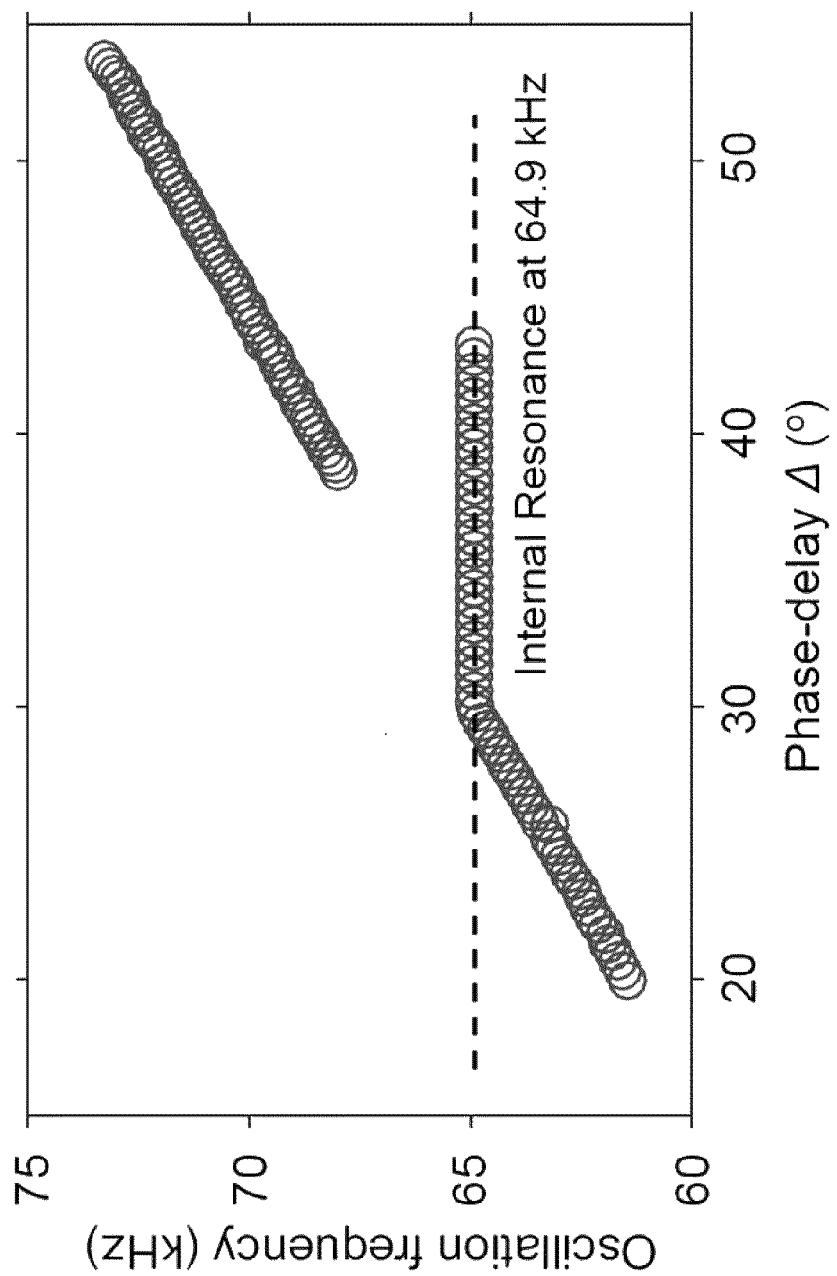
FIG. 2 is an illustration of the oscillation frequency tuned by a phase-delay feedback loop to satisfy the internal resonant mode coupling for a clamped-clamped silicon resonator.

FIG. 2 is an illustration of the oscillation frequency tuned by the phase delay of the feedback loop for the clamped-clamped silicon oscillator. As described above, the autonomous oscillating motion is initiated by thermal noise acting on the beam, whose velocity is then transduced to voltage and linearly amplified, before feeding back to drive the beam. As the vibrational amplitude grows, the oscillation frequency also increases due to the Duffing nonlinearity. The increasing frequency leads to larger viscous damping, until the energy dissipated through damping balances the energy supplied from the sustaining amplifiers, therefore arriving at stable oscillations. Additionally, the oscillation frequency can be tuned by varying the phase-delay imposed by the feedback loop, from 61.6 kHz to 64.9 kHz, where the IR condition is satisfied. As shown in FIG. 2, a frequency plateau occurs when the internal resonance is at 64.9 kHz. This frequency plateau is attributable to the IR, as in this condition the third harmonic of the in-plane motion excites the torsional mode, whose resonant frequency was measured as 194.7 kHz.

Figure 3B:
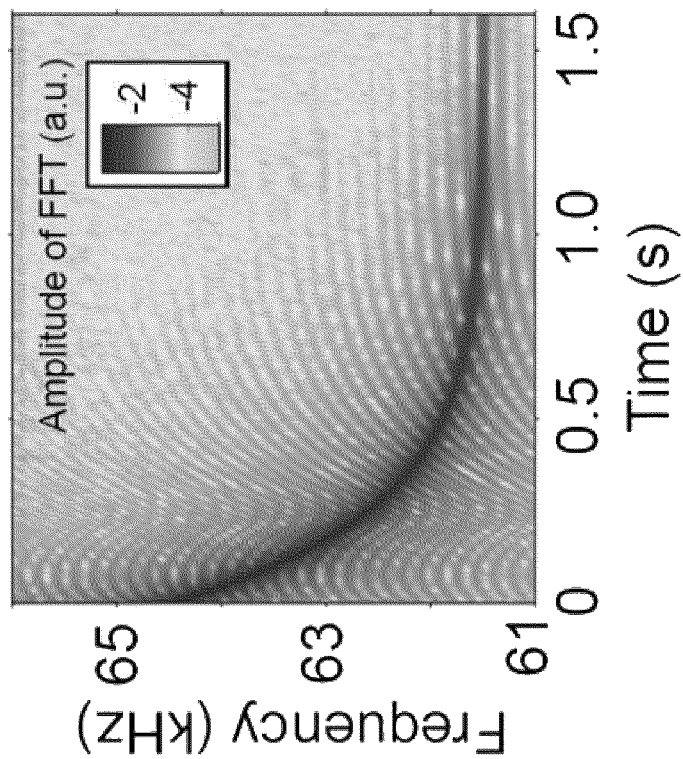
FIG. 3B is an illustration of the temporal frequency response of the oscillation involved in the measured temporal evolution shown in FIG. 3A.
Figure 3A:
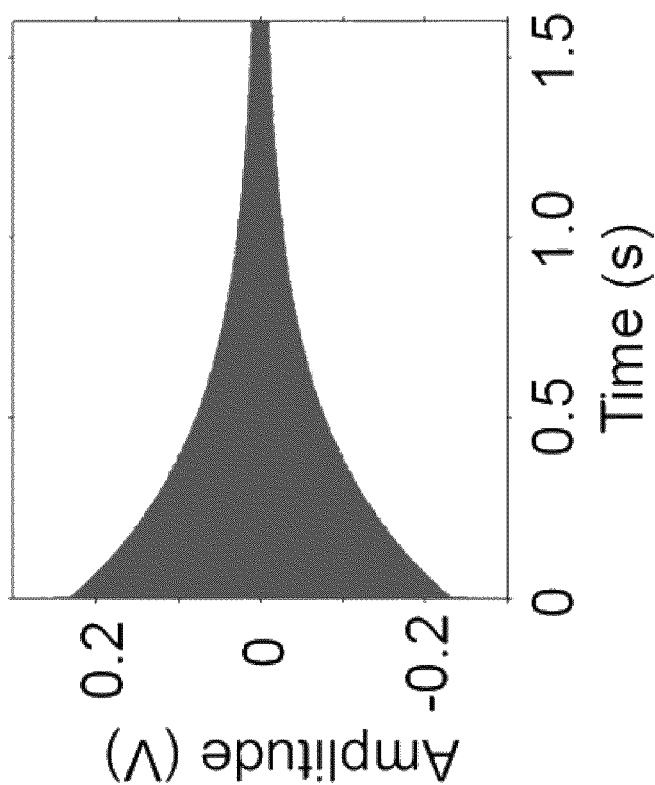
FIG. 3A is an illustration of the measured temporal evolution of the oscillation after the excitation is removed from a clamped-clamped silicon resonator operating in a nonlinear regime and outside of the internal resonant mode coupling.

FIG. 3A is an illustration of the measured temporal evolution of the oscillation after the excitation is removed from a clamped-clamped silicon resonator operating in a nonlinear regime and outside of the IR. When operating outside of the IR, the oscillator behaves normally, with an amplitude decay immediately after removing from closed loop operation and the frequency changes immediately as well. The decay rated is dictated by the quality factor, and had a calculated exponential decay time constant of 0.62 seconds, and an experimental exponential decay time constant of 0.47 seconds. This discrepancy is likely due to the presence of nonlinear damping. In contrast to linear oscillators where the frequency remains constant, the instantaneous frequency with the nonlinear oscillator will drift toward the linear resonance as shown in FIG. 3B. FIG. 3B is an illustration of the temporal frequency response of the oscillation involved in the measured temporal evolution shown in FIG. 3A. The power spectrum at each nominal time instance was obtained by performing non-overlapping fast Fourier transform ("FFT") of the time domain data in a narrow window around each nominal time instance.

FIG. 4A is an illustration of the measured temporal evolution of the oscillation after the excitation is removed from a clamped-clamped silicon resonator operating in a nonlinear regime and inside of the internal resonant mode coupling. When the oscillator is at IR (64.9 kHz), the oscillation amplitude does not decay, and remained constant, for as long as 227 ms after which the amplitude started to decrease as in conventional ring-down experiments. Moreover, during this period of time, the oscillation frequency stayed constant and stabilized at 64.9 kHz as shown in FIG. 4B. The power spectrum at each nominal time instance was obtained by performing non-overlapping FFT. The present invention's unexpected behavior of nearly constant amplitude and stabilized frequency is due to the structure and properties described, allowing for energy to transfer between coupled modes. The in-plane mode (first mode) receives energy from the torsional mode (second mode), thus compensating the energy loss due to the in-plane modes own energy dissipation. Once the energy of the torsional mode is depleted, the in-plane mode will begin normal ring-down as a nonlinear resonator.

Figure 5A:
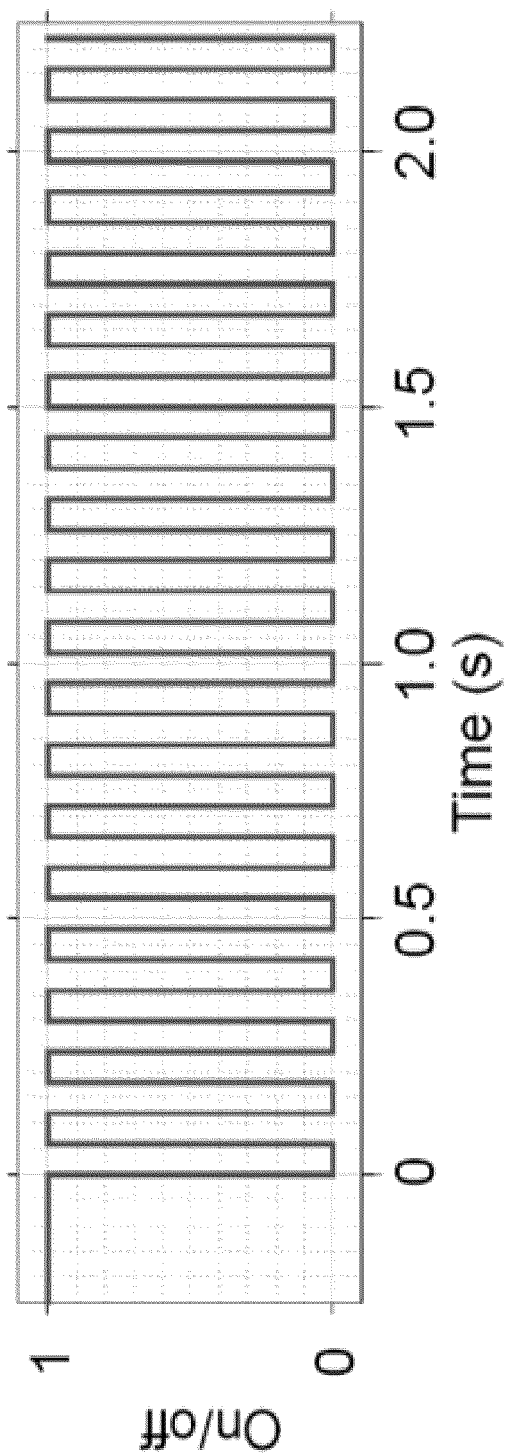
FIG. 5A is an illustration of the duty cycle profile that controls the engagement of the feedback loop for continuous oscillations with a 50% duty cycle.
Figure 5B:
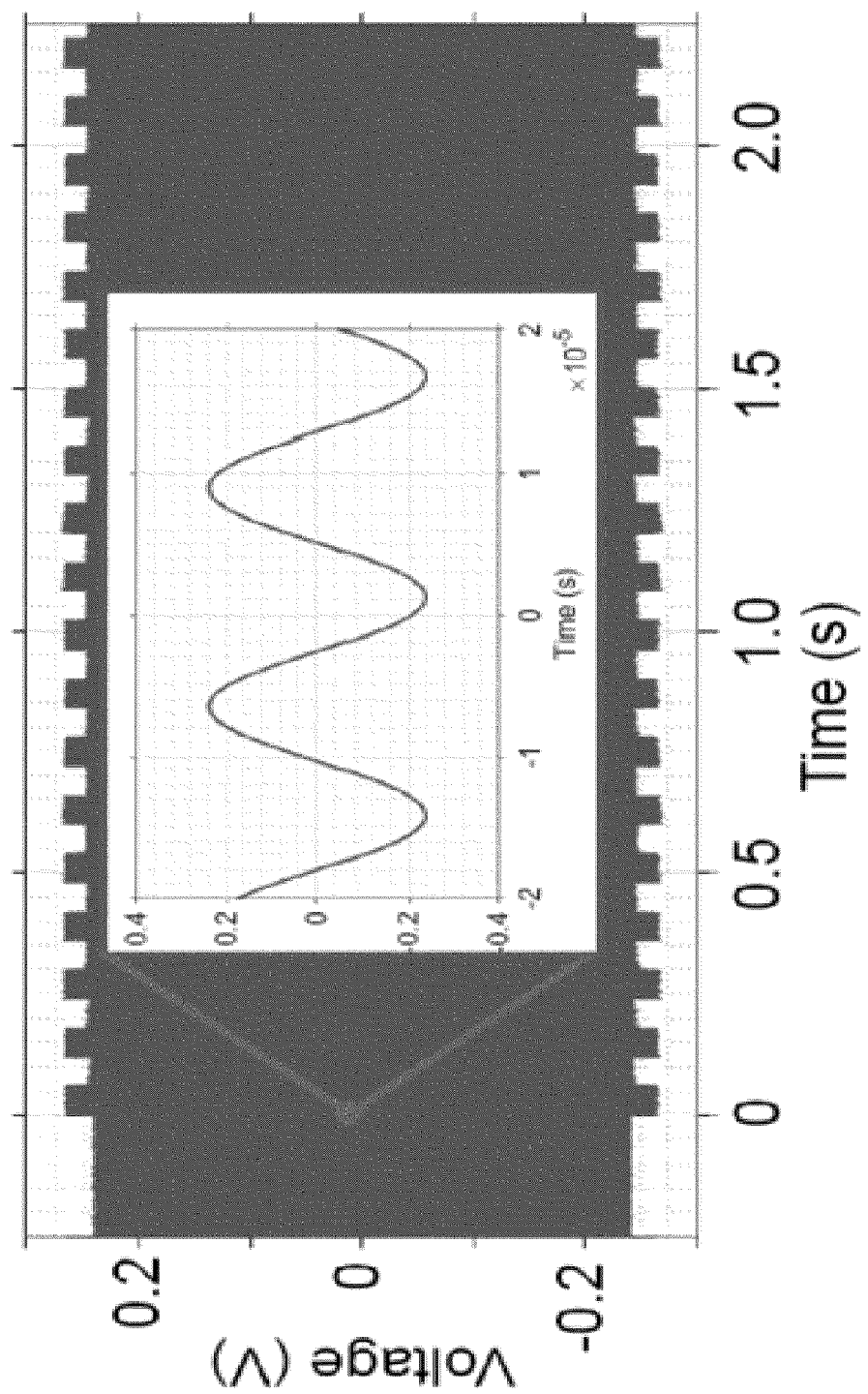
FIG. 5B is an illustration of the measured oscillation amplitude involved in the duty cycle profile of FIG. 5A. The inset shows a zoomed-in oscillation around t=0s.
Figure 5C:
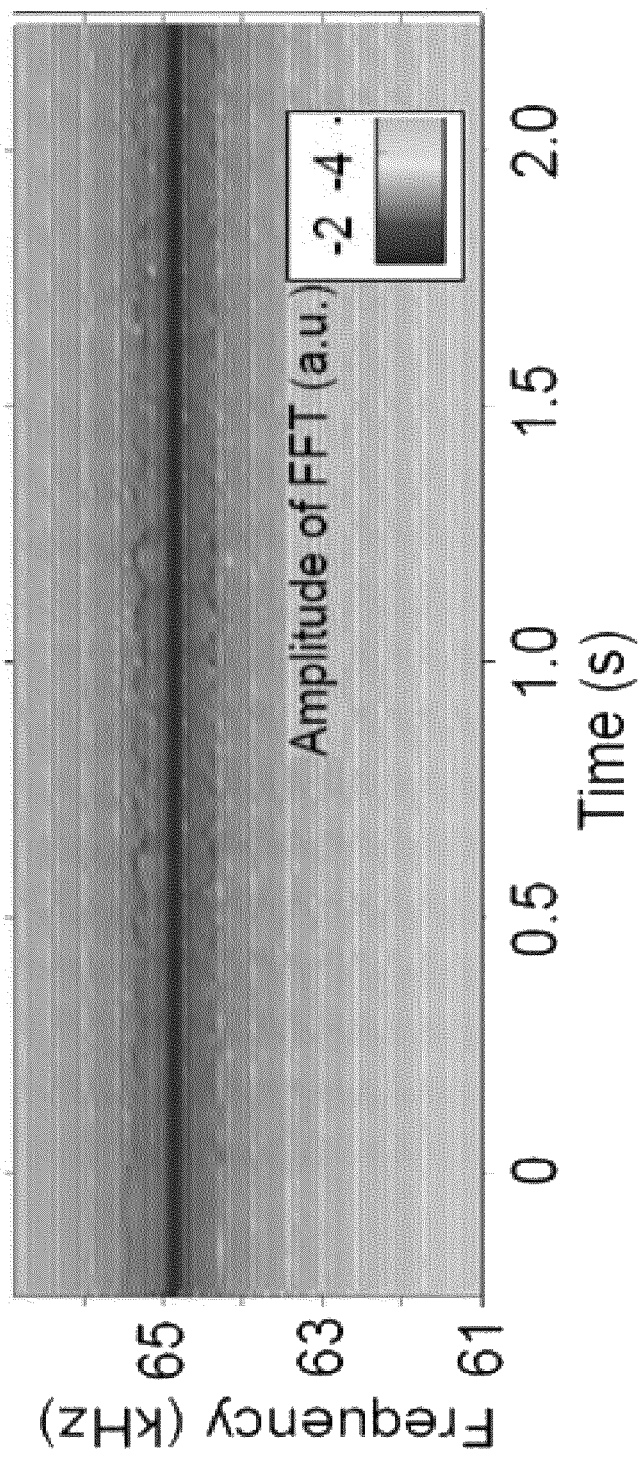
FIG. 5C is an illustration of the temporal frequency spectrum involved in the duty cycle profile of FIG. 5A.

FIGS. 5A-C demonstrate the continuous operation with the feedback circuit switched off for half of the time, with a cycle period of 120 ms. FIG. 5A is an illustration of the duty cycle profile that controls the engagement of the feedback loop for continuous oscillations with a 50% duty cycle. FIG. 5B is an illustration of the measured oscillation amplitude involved in the duty cycle profile of FIG. 5A. The inset shows a zoomed-in oscillation around t=0s. FIG. 5C is an illustration of the temporal frequency spectrum involved in the duty cycle profile of FIG. 5A. As seen in FIG. 5B and FIG. 5C, both the amplitude and frequency show no sign of discontinuity or decrease and there is no obvious changes in frequency stability during the on and off period, thus maintaining the improvement brought by IR.

As described herein, many oscillators with either the flexural or an alternative resonator design can be driven to the condition of IR where there is mutual energy transfer between the coupled modes. The structure and properties of the present invention show that without an external, sustaining feedback circuit to replenish the energy dissipated, the IR condition allows for energy to transfer from a high-frequency vibration mode (second mode) to the fundamental one (first mode), keeping the oscillator vibrating with a stabilized frequency for a period of time. Additionally, if the oscillator is placed back in the feedback loop before the amplitude starts to decay, then the output voltage is constant with a constant frequency the entire time (even as the feedback loop is opened and closed) demonstrating the oscillator's ability to store and recover vibrational energy in coupled modes. Further, the present invention can be used to extend the same effect to the mutual entrainment and coupling of two or more oscillators storing energy in multiple vibrational modes, and could assist in increasing the time over which the oscillators can maintain the amplitude and frequency disconnected from the external power source.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the term "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present disclosure.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system comprising:
an amplifier operably connected to a phase shifter and an oscillator, wherein the amplifier is configured to amplify a voltage or convert a current from the oscillator and sustain an oscillator amplitude and an oscillator frequency;
the oscillator operably connected to the amplifier, wherein the phase shifted voltage drives the oscillator, wherein the oscillator is at an internal resonance condition based at least on the amplitude or phase of the phase shifted voltage, and wherein the internal resonance condition stabilizes frequency oscillations in the oscillator;
a resonator placed into self-sustained motion and operably connected to a connection terminal wherein a first electrode in the resonator applies a periodic electrostatic force and a second electrode in the resonator is used to transduce the motion of the resonator through a motional current;
the oscillator operably connected to the resonator, wherein the phase shifted voltage drives the oscillator, the oscillator is driven to non-linear behavior, wherein the oscillator comprises a first mode and a second mode, wherein energy is transferred from the first mode to the second mode in the resonance condition, and the transferred energy is stored in vibrational amplitude in the second mode, wherein the vibrational amplitude of the second mode results in the coupling between the first and the second mode and is proportional to the amplitude of the first mode, and the transferred energy stabilizes the frequency oscillations in the oscillator; and
an external power source operably and removably connected to the oscillator, wherein the energy stored in the second mode is transferred to the first mode maintain the oscillator amplitude and the oscillator frequency when the external power source is removed.

2. The system of claim 1, wherein the first mode being an in-plane mode and the second mode being a torsional mode.

3. The system of claim 1, wherein the oscillator is formed from a clamped-clamped beam resonator.

4. The system of claim 3, wherein the clamped-clamped beam resonator has silicon beams.

5. The system of claim 1, wherein the oscillator is coupled with additional oscillators, wherein each oscillator in the system exhibits either a hardening or softening nonlinearity.

6. The system of claim 1, wherein the resonator in the oscillator has flexure based compliant mechanism.

7. The system of claim 1, wherein the oscillator is a micro-mechanical oscillator.

8. The system of claim 1, wherein the oscillator is a nano-mechanical oscillator.

9. The system of claim 1, wherein the first mode is a low frequency mode and the second mode is a high frequency mode.

10. A method comprising:
powering an oscillator with an external power source;
converting a motional current to a voltage using a transimpedance amplifier, from an oscillator;
amplifying a voltage, using an amplifier, from the oscillator;
attaining an amplitude and an operating frequency in the oscillator;
maintaining the operating frequency;
phase shifting the amplified voltage;
setting an amplitude of the phase shifted voltage;
driving the oscillator using the phase shifted voltage, wherein the phase shifted voltage drives the oscillator, wherein the oscillator is at an internal resonance condition based at least on the amplitude of the phase shifted voltage, wherein the oscillator comprises a first mode and a second mode, wherein energy is transferred from the first mode to the second mode in the resonance condition, and the transferred energy is stored in vibrational amplitude in the second mode, wherein the vibrational amplitude of the second mode results in the coupling between the first and the second mode and is proportional to the amplitude of the first mode, and the transferred energy stabilizes the frequency oscillations in the oscillator
placing a resonator in self-sustained motion;
driving the oscillator using the resonator, wherein the phase shifted voltage drives the oscillator to non-linear behavior; and
removing the external power source connected to the oscillator, wherein the energy stored in the second mode is transferred to the first mode maintain the oscillator amplitude and the oscillator frequency.

11. The method of claim 10, further comprising reconnecting the external power source after a given period of time from removing the external power source before the oscillator amplitude decays.

12. The method of claim 10, wherein the first mode being an in-plane mode and the second mode being a torsional mode.

13. The method of claim 10, wherein the oscillator is formed from a clamped-clamped beam resonator.

14. The method of claim 10, wherein the oscillator is coupled with additional oscillators, wherein each oscillator in the system exhibits either a hardening or softening nonlinearity.

15. The method of claim 10, wherein the resonator in the oscillator has a flexure based compliant mechanism.

16. The method of claim 10, wherein the oscillator is a micro-mechanical oscillator.

17. The method of claim 10, wherein the oscillator is a nano-mechanical oscillator.

18. The method of claim 10, wherein the non-linear behavior is described by the Duffing equation or similar equation.

19. The method of claim 10, wherein the internal resonance has a frequency between 61 kHz and 64.9 kHz.

20. A clamped-clamped oscillator comprising:
an amplifier operably connected to a phase shifter, wherein the amplifier is configured to amplify a voltage or convert a current from an oscillator and sustain an oscillator amplitude and an oscillator frequency;
the oscillator operably connected to the amplifier, wherein the phase shifted voltage drives the oscillator, wherein the oscillator is at an internal resonance condition based at least on the amplitude or phase of the phase shifted voltage, and wherein the internal resonance condition stabilizes frequency oscillations in the oscillator;
a resonator placed into self-sustained motion and operably connected to a connection terminal wherein a first electrode in the resonator applies a periodic electrostatic force and a second electrode in the resonator is used to transduce the motion of the resonator through a motional current; and
the oscillator operably connected to the resonator, wherein the phase shifted voltage drives the oscillator, the oscillator is driven to non-linear behavior, wherein the oscillator comprises a first mode and a second mode, wherein energy is transferred from the first mode to the second mode in the resonance condition, and the transferred energy is stored in vibrational amplitude in the second mode, wherein the vibrational amplitude of the second mode results in the coupling between the first and the second mode and is proportional to the amplitude of the first mode, and the transferred energy stabilizes the frequency oscillations in the oscillator.

\* \* \* \* \*